United States Patent
Koh et al.

(10) Patent No.: US 7,522,886 B2
(45) Date of Patent: Apr. 21, 2009

(54) RADIO FREQUENCY TRANSCEIVERS

(75) Inventors: Lean Wui Leon Koh, Singapore (SG);
Eng Poh Pang, Singapore (SG)

(73) Assignee: Amplus Communication Pte. Ltd.,
Singapore (SG)

( * ) Notice: Subject to any disclaimer, the term of this patent is extended or adjusted under 35 U.S.C. 154(b) by 0 days.

(21) Appl. No.: 10/508,066

(22) PCT Filed: Aug. 21, 2003

(86) PCT No.: PCT/SG03/00197

§ 371 (c)(1),
(2), (4) Date: Jun. 13, 2005

(87) PCT Pub. No.: WO2004/032588

PCT Pub. Date: Apr. 15, 2004

(65) Prior Publication Data

US 2005/0239418 A1    Oct. 27, 2005

(30) Foreign Application Priority Data

Oct. 3, 2002    (SG)    ................................ 200206022

(51) Int. Cl.
*H04B 1/38*    (2006.01)
(52) U.S. Cl. ................... 455/73; 455/81; 455/450.1; 455/575.2; 455/306; 361/718; 361/719; 361/720
(58) Field of Classification Search ............... 455/73, 455/450.1, 575.5, 575.2, 81, 306, 302, 315, 455/301, 209; 174/255; 361/718, 719, 720
See application file for complete search history.

(56) References Cited

U.S. PATENT DOCUMENTS

| 4,558,285 | A | * | 12/1985 | Shrestha et al. | ............... | 330/53 |
|---|---|---|---|---|---|---|
| 4,658,334 | A | * | 4/1987 | McSparran et al. | ......... | 361/800 |
| 4,739,453 | A | * | 4/1988 | Kurokawa | .................... | 361/816 |
| 5,483,413 | A | | 1/1996 | Babb | | |
| 6,414,246 | B1 | | 7/2002 | Palmteer | | |
| 6,504,095 | B1 | | 1/2003 | Hoffstrom | | |
| 6,600,659 | B1 | * | 7/2003 | Barnett et al. | ................ | 361/761 |
| 6,741,142 | B1 | * | 5/2004 | Okazaki et al. | ............ | 333/99 S |
| 6,788,171 | B2 | * | 9/2004 | Ammar et al. | ............... | 333/247 |
| 6,847,527 | B2 | * | 1/2005 | Sylvester et al. | ............ | 361/763 |

(Continued)

FOREIGN PATENT DOCUMENTS

JP    6-204638    7/1994

(Continued)

*Primary Examiner*—Tuan A Pham
(74) *Attorney, Agent, or Firm*—Blakely, Sokoloff, Taylor & Zafman LLP

(57) ABSTRACT

A radio frequency transceiver having a printed circuit board (PCB) on which are located a plurality of components, the PCB being sandwiched between a base and a cover. The cover having a plurality of components for accommodating each of the plurality of components to separate the plurality of components into a number of virtual modules. All interconnects between the number of virtual modules are in the PCB. The PCB has a radio frequency (RF) layer, a RF ground layer, a direct current (DC) layer, and a DC ground layer. There is a plurality of via holes from the RF ground layer to the DC ground layer to provide virtual RF ground.

23 Claims, 3 Drawing Sheets

U.S. PATENT DOCUMENTS

2003/0027530 A1* 2/2003 Levitt et al. .................... 455/73
2003/0047350 A1* 3/2003 Forbes ........................ 174/255
2003/0163748 A1* 8/2003 Calkins et al. .............. 713/500
2004/0127249 A1* 7/2004 Hankui et al. ............ 455/550.1

FOREIGN PATENT DOCUMENTS

| JP | 11-159842 | 6/1999 |
| WO | WO 01/39564 | 5/2001 |

* cited by examiner

RADIO FREQUENCY TRANSCEIVERS

CROSS-REFERENCE TO OTHER APPLICATIONS

This Application is a National Phase of International Application No. PCT/SG2003/000197, filed on Aug. 21, 2003, which claims priority from Singaporean Patent Application No. 200206022-6, filed on Oct. 3, 2002.

FIELD OF THE INVENTION

The present invention relates to radio frequency transceivers and refers particularly, though not exclusively, to radio frequency transceiver constructed using a virtual modular arrangement.

BACKGROUND TO THE INVENTION

Present radio frequency transceivers are constructed using several separate modules each having a required electrical function. Each module is securely mounted in a housing (a large box) and the modules are interconnected as required using wires, cables, and so forth. This involves considerable labour, and results in a housing that is relatively large. Many interconnects are required.

It is therefore a principal object of the present invention to provide a radio frequency transceiver where interconnects between modules are generally not required.

A further object of the present invention is to provide a radio frequency transceiver where virtual modules are used.

Another object of the resent invention is to provide a radio frequency transceiver where the construction aids heat dissipation.

A final object of the present invention is to provide a multi-layer printed circuit board for use with such a radio frequency transceiver.

SUMMARY OF THE INVENTION

With the above and other objects in mind, the present invention provides a radio frequency transceiver having a printed circuit board on which are located a plurality of components, the printed circuit board being sandwiched between a base and a cover, the cover having a plurality of means for accommodating each of the plurality of components to separate the plurality of components into a number of virtual modules.

All interconnects between the number of virtual modules are preferably in the printed circuit board.

Both the base and the cover may be made of a heat conductive material so that at least one of the base and the cover may act as a heat sink.

Each of the means for accommodating may be a compartment in a lower surface of the cover. Each compartment may recess into lower surface of the cover, and each recess may be of a depth sufficient to accommodate the component to be located therein. One of the recesses pass may completely through the cover.

The compartments may be formed by pathways projecting downwardly from the lower surface of the cover, the pathways forming the compartments therebetween.

The cover may include a plurality of pathways for aligning with a plurality of DC pathways in the printed circuit board. The plurality of pathways may extend downwardly from the cover.

The printed circuit board may include a radio frequency layer, a radio frequency ground layer, a DC layer, and a DC ground layer. There may be a plurality via holes from the radio frequency ground layer to the DC ground layer to provide virtual radio frequency ground.

The plurality of components may includes one or more of down converter, reference oscillator, at least one band pass filter, C-band synthesizer, at least one up converter, and at least one L-band synthesizer.

The DC layer may include the DC pathways to provide power connections to all the virtual modules; and each compartment may be of dimensions to substantially eliminate higher order modes of signal propagation. Furthermore, and more preferably, radio frequency radiation for each virtual module is contained within that virtual module. Each virtual module preferably comprises one means for accommodating and at least one component.

The base may provide a radio frequency ground; and the DC layer may include a pattern of a plurality of fans that, in combination with the DC ground layer and radio frequency ground layer, form capacitors to filter radio frequency signals to ground.

In another form, the present invention provides a radio frequency transceiver having a printed circuit board on which are mounted a plurality of components comprising the radio frequency transceiver and a cover; the cover including a lower surface with means for separating the cover into at least two compartments, each compartment for receiving therein at least one of the plurality of components to create at least two virtual modules.

In a final form the present invention provides a printed circuit board for use with a radio frequency transceiver wherein the printed circuit board has a radio frequency layer, a radio frequency ground layer, a DC layer, and a DC ground layer. There may be a plurality via holes from the radio frequency ground layer to the DC ground layer to provide virtual radio frequency ground. The base may provide a radio frequency ground; and the DC layer may include a pattern of a plurality of fans that, in combination with the DC ground layer and radio frequency ground layer, form capacitors to filter radio frequency signals to ground. The DC layer may include a plurality of DC pathways to provide power connections to a plurality of components mountable on the printed circuit board, the plurality of components being arranged as a number of virtual modules.

DESCRIPTION OF THE DRAWINGS

In order that the invention may be clearly understood and readily put into practical effect there shall now be described by way on non-limitative example only a preferred embodiment of the present invention, the description being with reference to the accompanying illustrative drawings in which.

DESCRIPTION OF PREFERRED EMBODIMENT

Figure 1:
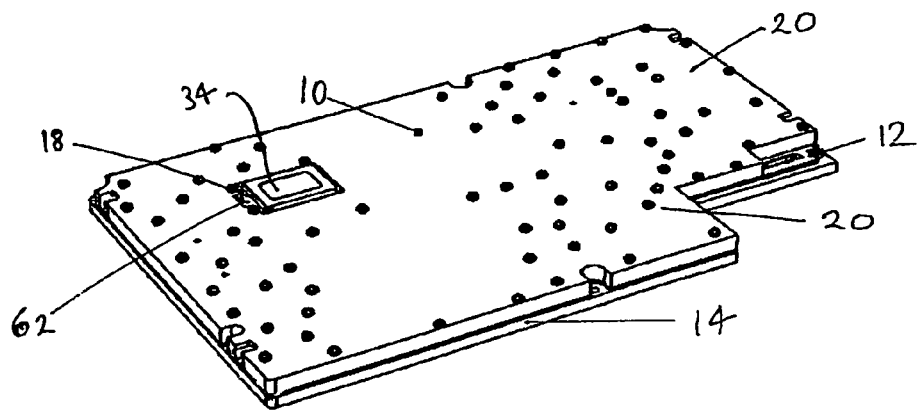
FIG. 1 is a perspective view of the preferred embodiment removed from the housing (not shown)

To first consider FIG. 1, there is shown a radio frequency transceiver removed from its housing (not shown) and having a cover 10, a printed circuit board 12 and a base 14. The cover 10 and base 14 "sandwich" the printed circuit between them.

Figure 6:
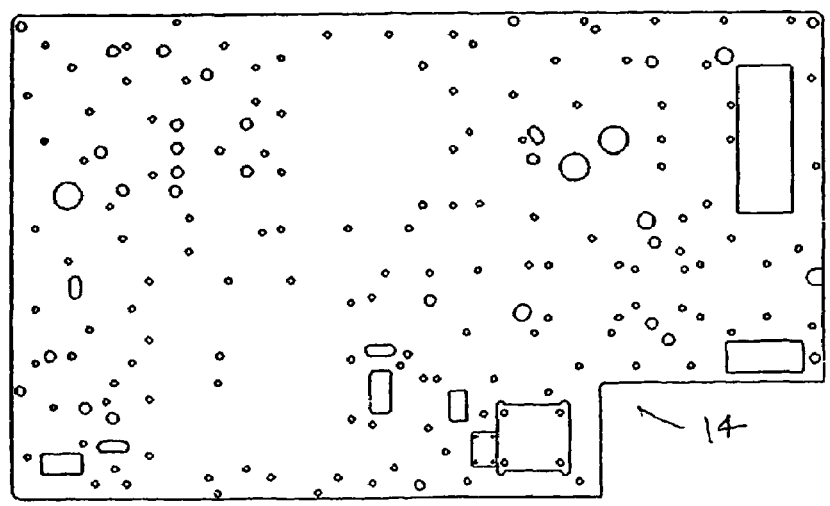
FIG. 6 is a top plan view of the base.

Base 14 (FIG. 6), is generally planar and has a top surface that is flat. Preferably, base 14 is made of a heat-conductive material such as, for example, aluminium so that it will aid heat dissipation from the various components mounted on the printed circuit board. By using aluminium the overall weight is also reduced. Effectively, the base 14 acts as a heat sink and acts as a support for the printed circuit board 12. It also provides a radio frequency ground. The shape of the base 14 closely follows the shape of both the printed circuit board 12 and the cover 10. The base 14 may be secured to cover 10 using screws, nuts and bolts, clips, or other readily releasable yet secure fastening.

Figure 2:
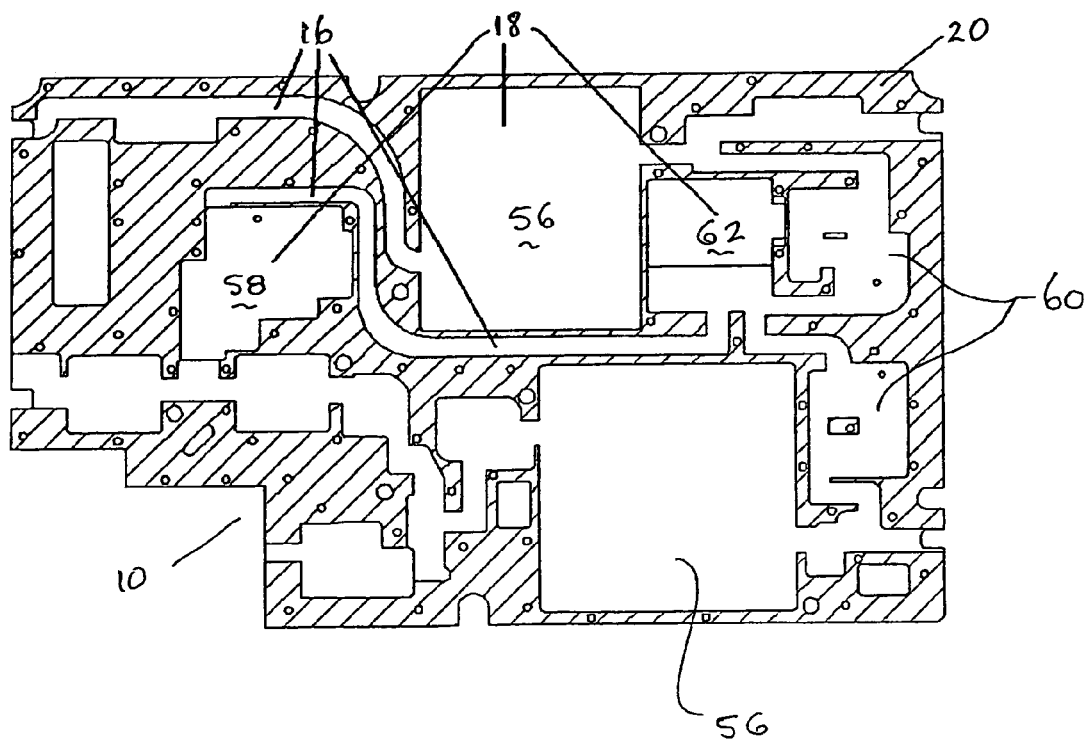
FIG. 2 is an underneath view of the cover of FIG. 1.

To now refer to FIG. 2, the cover 10 is also generally planar and has a generally flat top 20. Cover 10 also has a plurality of pathways 16 and compartments 18. The compartments 18 are sized, shaped and located to align, preferably align exactly (within reasonable manufacturing tolerances) with components mounted on the printed circuit board 12. The compartments 18 may be in the form of concave recesses into the lower surface of cover 10, with each compartment 18 being recessed to a sufficient extent to accommodate the components on printed circuit board 12 to be located therein. Alternatively, the compartments 18 may be formed by pathways 16 projecting downwardly to from compartments 18 therebetween. Each compartment 18 may be recessed differently to accommodate its components, or all compartments 18 may be recessed to the same depth.

The pathways 16 are sized, shaped and located to align exactly (within reasonable manufacturing tolerances) with the DC pathways of the printed circuit board 12. The radio frequency signal travels along the pathways 16 from one compartment 18 to another compartment 18.

In this way, the combination of the pathways 16 and compartments 18, in combination with components mounted on printed circuit board 12, create virtual modules on printed circuit board 12, and in cover 10. As such, any radiation is kept within each virtual module and, as such, should not interfere with other virtual modules. Preferably, by controlling the dimensions of each compartment 18, higher order modes of signal propagation may be eliminated.

Like base 14, cover 10 may be made of a heat conductive material such as, for example, aluminium. In this way it aids heat dissipation from the components on printed circuit board 12. This means that, in effect, the cover 10 is also acting as a heat sink.

If desired, and particularly for components on printed circuit board of greater height, one or more of the compartments 18 may pass through top 20, as is shown in FIG 1. The shape of the cover 10 closely follows the shape of both the printed circuit board 12 and base 14. The cover 10 may be releasably secured to the base 10 by use of one or more of screws, nuts and bolts, dips, or other readily releasable yet secure fastening. Holes 22 through cover 10 may be provided to assist this.

Figure 3:
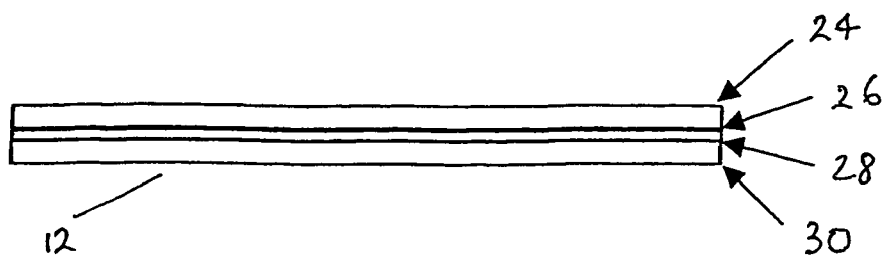
FIG. 3 is a side view of the printed circuit board of FIG. 1.

FIG. 3 shows the construction of the printed circuit board 12. It has four layers: a radio frequency layer (top) 24, a radio frequency ground layer (second top) 26, a DC layer (second bottom) 28, and a DC ground layer (bottom) 30.

The DC ground layer 30 is connected to the radio frequency ground 26 by a plurality of via holes, thus producing a virtual radio frequency ground. By doing this it is possible to maintain the same radio frequency potential through the radio frequency transceiver at the radio frequency ground 26, base 14, and cover 10.

The radio frequency layer 24 and the radio frequency ground 26 form the micro-strip transmission for the radio frequency circuits. Between the radio frequency layer 24 and the radio frequency ground 25 is a dielectric layer (not shown). This may be FR-4 as using FR-4 as a base material may decrease manufactured cost. The thickness of the dielectric layer determines the 50-ohm transmission line width.

Figure 4:
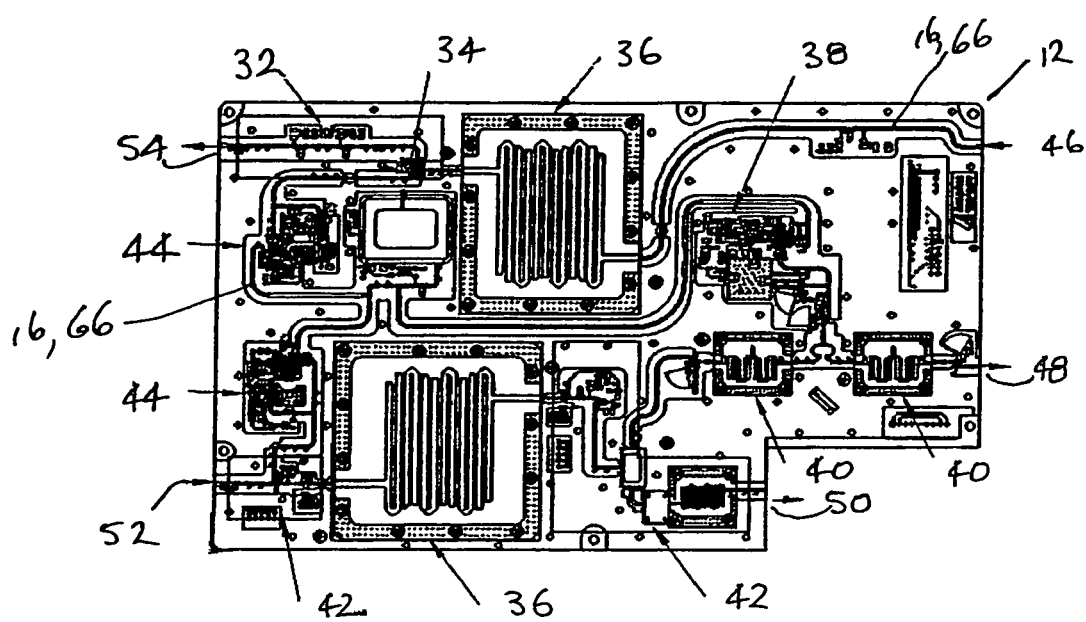
FIG. 4 is a top plan view of the cover and the printed circuit board and the cover, the top plate of the cover having been removed.

The printed circuit board as shown in FIG. 4 has a number of components mounted thereon including, but not being limited to: down converter 32, a reference oscillator 34 two band pass filters 36, C-band synthesizer 38, two low band pass filters 40, two up converters 42, and two L-band synthesizers 44. There maybe LNB RF in and out terminals 46, 48 respectively; an output connect 50 for the power amplifies; and 70 MHz IF in and out connectors 52, 54 respectively.

Each of the components on printed circuit board is able to be located in a compartment 18 in cover 10. For example, each band pass filter 36 locates in a compartment 56; C-band synthesizer 38 in compartment 58; each L-band synthesizer 44 in a compartment 60; oscillator 34 in compartment 62; and so forth. Although it is preferred for there to be only one component for each compartment 18, there may be more than one component (e.g. two or three) in a single compartment 18.

All components on the printed circuit board 12 are connected, preferably using 50-ohm traces. This eliminates the connection of components by interconnects, as in the past.

Figure 5:
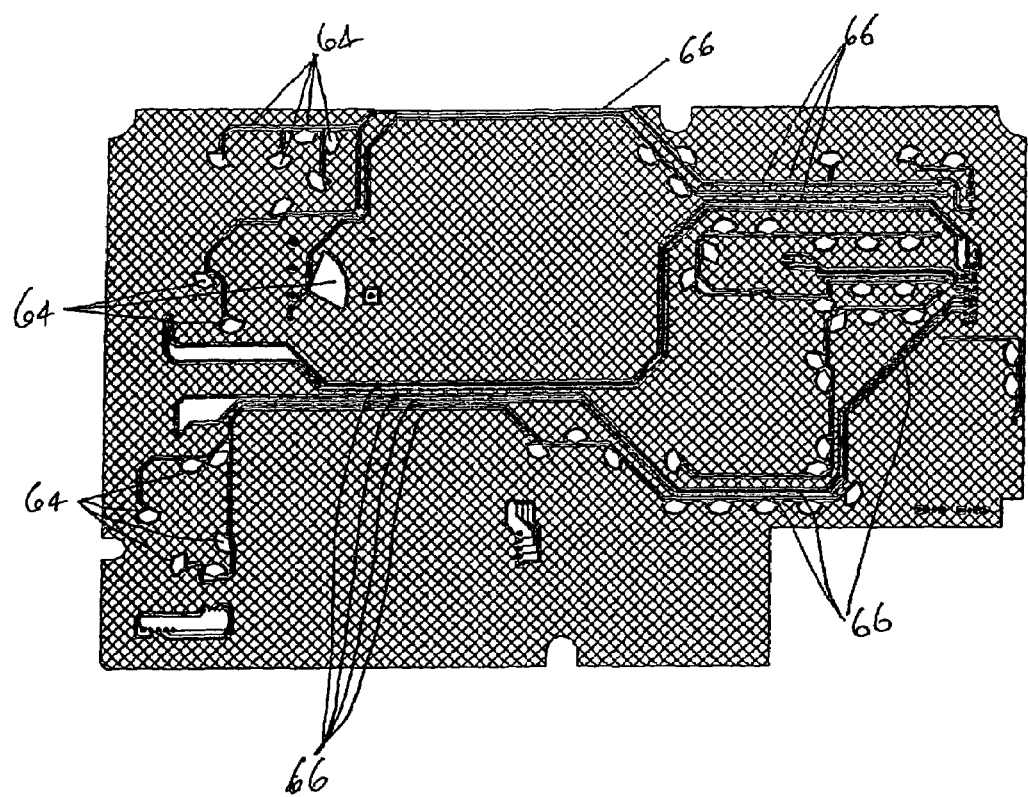
FIG. 5 is a plan view of the printed circuit board showing the connection between the modules.

The pathways 16 are sized, shaped and located to align exactly (within reasonable manufacturing tolerances) with the DC pathways 66, as show in FIG. 5. The DC pathways 66 are in the DC layer 28. Besides functioning as the DC power connection to all the virtual modules, the DC pathways 66 serve to control and monitor the virtual modules. Each virtual module is a combination of a component on printed circuit board 12 and its relevant compartment 18; and the virtual modules are separated by pathways 16.

The DC layer 28 preferably has a pattern of "fans" 64 that, in combination with the DC ground layer 30 and radio frequency ground layer 26, form capacitors to filter the radio frequency signals to the ground (i.e. base 14) so that interference between virtual modules will be minimized. This, together with the virtual modules formed by the combination of the components on printed circuit board 12 and their respective compartments 18, reduces the interference between the virtual modules.

Whilst there has been described in the foregoing description a preferred embodiment of the present invention, it will be understood by those skilled it the technology that many variations in details of design or construction may be made without departing from the present invention.

The present invention extends to all features disclosed both individually, and in all possible permutations and combinations.

The invention claimed is:

1. A radio frequency transceiver having a single printed circuit board on which are located a plurality of components including at least a local oscillator and a filter, the printed circuit board including a first radio frequency ground and a virtual radio frequency ground, and, the printed circuit board being sandwiched between a cover and a base, wherein the base includes a second radio frequency ground, whereby the cover includes a plurality of means for accommodating each of the plurality of components to separate the plurality of components into a number of virtual modules, the printed circuit board includes a radio frequency layer, a radio frequency ground layer, a DC layer, and a DC ground layer, and the DC layer includes a plurality of fan-shaped configurations that, in combination with the virtual radio frequency ground and the radio frequency ground layer, form a capacitive filter adapted for filtering an unwanted radio frequency signal to ground and suppressing an interference signal between the virtual modules.

2. A radio frequency transceivers as claimed in claim 1, wherein all interconnects between the number of virtual modules are in the printed circuit board.

3. A radio frequency transceiver as claimed in claim 1 wherein both the base and the cover are made of a heat conductive material.

4. A radio frequency transceiver as claimed in claim 3, wherein at least one of the base and the cover act as a heat sink.

5. A radio frequency transceiver as claimed in claim 1, wherein each compartment is a recess into lower surface of the cover.

6. A radio frequency transceiver as claimed in claim 5, wherein each recess is of a depth sufficient to accommodate the component to be located therein.

7. A radio frequency transceiver as claimed in claim 5, wherein at least one of the recesses passes completely through the cover.

8. A radio frequency transceiver as claimed in claim 1 wherein the compartments are formed by pathways projecting downwardly from the lower surface of the cover; the pathways forming the compartments therebetween.

9. A radio frequency transceiver as claimed in claim 1, wherein the cover includes plurality of pathways for aligning with a plurality of DC pathways in the printed circuit board.

10. A radio frequency transceiver as darned in claim 9, wherein the plurality of pathways extend downwardly from the cover.

11. A radio frequency transceiver as claimed in claim 1, wherein there is a plurality of via holes from the radio frequency ground layer to the DC ground layer to provide a virtual radio frequency ground.

12. A radio frequency transceiver as claimed in claim 1, wherein the plurality of components includes one or more selected from the group consisting of: down converter, reference oscillator, at least one band pass filter, C-band synthesizer, at least one up converter, and at least one L-band synthesizer.

13. A radio frequency transceiver as claimed in claim 9, wherein the DC layer includes the DC pathways to provide power connections to all the virtual modules.

14. A radio frequency transceiver as claimed in claim 1, wherein radio frequency radiation is for each virtual module is contained within that virtual module.

15. A radio frequency transceiver as claimed in claim 1, wherein each virtual module comprises one means for accommodating and at least one component.

16. A radio frequency transceiver as claimed in claim 1, wherein the base provides a radio frequency ground.

17. A radio frequency transceiver as claimed in claim 1, wherein the cover includes a lower surface with means for separating the cover into at least two compartments, each compartment for receiving therein at least one of the plurality of components to create at least two virtual modules.

18. A radio frequency transceiver as claimed in claim 1, wherein the plurality of accommodating portions is a compartment in a lower surface of the cover, and each compartment is of dimensions to substantially eliminate higher order modes of signal propagation.

19. A radio frequency transceiver as claimed in claim 1, wherein each of the plurality of the accommodating portions is a compartment in a lower surface of the cover.

20. A radio frequency transceiver as claimed in claim 1 wherein the cover includes a lower surface with a separating portion for separating the cover into at least two compartments, each compartment for receiving therein at least one of the plurality of components to create at least two virtual modules.

21. A printed circuit board for use with a radio frequency transceiver wherein the printed circuit board has a radio frequency layer, a radio frequency ground layer, a DC layer, and a DC ground layer; the DC layer including a plurality of DC pathways to provide power connections to a plurality of components mountable on the printed circuit board, the plurality of components being arranged as a number of virtual models, wherein the DC layer includes a plurality of fan-shaped configurations that, in combination with the virtual radio frequency ground and the radio frequency ground layer, form a capacitive filter adapted for filtering an unwanted radio frequency signal to ground and suppressing an interference signal between the virtual modules.

22. A printed circuit board as claimed in claim 21, wherein there is a plurality of holes from the radio frequency ground layer to the DC ground layer to provide virtual radio frequency ground.

23. A printed circuit board as claimed in claim 21, wherein the base provides a radio frequency ground.

* * * * *